United States Patent [19]

Hoffmann

[11] 4,180,806

[45] Dec. 25, 1979

[54] ARRANGEMENT, IN PARTICULAR AN ANALOG-DIGITAL CONVERTER AND METHOD OF OPERATION THEREOF

[75] Inventor: Kurt Hoffmann, Taufkirchen, Fed. Rep. of Germany

[73] Assignee: Siemens Aktiengesellschaft, Berlin & Munich, Fed. Rep. of Germany

[21] Appl. No.: 834,786

[22] Filed: Sep. 19, 1977

Related U.S. Application Data

[62] Division of Ser. No. 612,570, Sep. 11, 1975, Pat. No. 4,091,378.

[30] Foreign Application Priority Data

Sep. 20, 1974 [DE] Fed. Rep. of Germany ....... 2445142

[51] Int. Cl.$^2$ ............................................. H03K 13/02
[52] U.S. Cl. ............................................. 340/347 AD
[58] Field of Search ... 340/347 AD, 347 M, 347 DA; 307/354, 362

[56] References Cited

U.S. PATENT DOCUMENTS

| | | | |
|---|---|---|---|
| 3,610,960 | 10/1971 | Hofstein | 340/347 M |
| 3,812,478 | 5/1974 | Tomisawa | 340/347 DA X |

*Primary Examiner*—Charles D. Miller
*Attorney, Agent, or Firm*—Hill, Van Santen, Steadman, Chiara & Simpson

[57] ABSTRACT

An arrangement, particularly an analog-digital converter having a resistance line or chain, and a plurality of voltage comparators, each preferably comprising an insulator-layer, field-transistor and a load element in the form of a resistance, capacitor or diode, in which the control electrode terminal of each transistor forms a first comparator input, which is connected to a respective point on the resistance and with each cooperable load element being connected to one of the two remaining transistor terminals, one of which also simultaneously forms the output of such voltage comparator, and with the second comparator input for such voltage comparator being formed by the other transistor terminal. Preferably, the transistors are formed on a semiconductor substrate which has doped areas forming respective source and drain electrodes with the associated gate electrodes being disposed in insulated relation to the semiconductor substrate and formed of an electrical resistance material which serially interconnects the adjacent gate electrodes of the transistors, with one of the doped electrodes of each transistor comprising a respective part of a continuously doped area of the semiconductor substrate which thus forms a common terminal for all transistors, while the other doped electrode of each transistor extends outwardly away from such common terminal to form respective individual terminals. The invention also includes the method of operating such structures.

1 Claim, 15 Drawing Figures

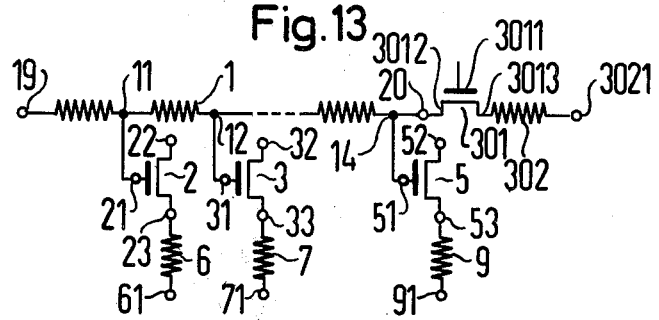
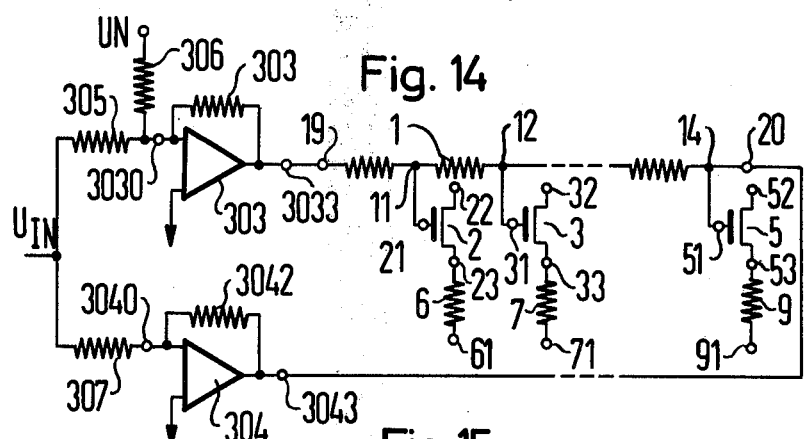
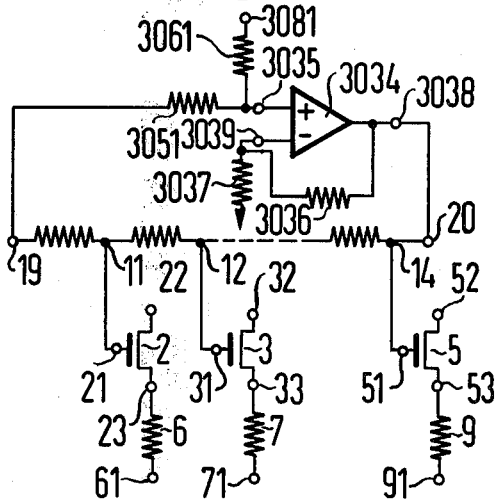

ARRANGEMENT, IN PARTICULAR AN ANALOG-DIGITAL CONVERTER AND METHOD OF OPERATION THEREOF

This is a division, of application Ser. No. 612,576, filed Sept. 11, 1975 now U.S. Pat. No. 4,091,378.

BACKGROUND OF THE INVENTION

The invention relates to an arrangement, particularly an analog-digital converter, having a resistance line or resistance chain to which are connected respective voltage comparators having a first comparator input thereof connected at respective points along the resistance with the first comparator input in each case comprising the control electrode terminal of a transistor.

An analog-digital converter of this general type is described in prior publication "High-Speed A/D Converter Monolithic Techniques" in IEE CAT. N. 72 C3/IFFCC, pages 146-147 by D. R. Breuer. In the described circuit the voltage comparator comprises expensive circuits employing operational amplifiers, as a result of which an analog-digital converter utilizing the same cannot be produced, without difficulties, in the form of integrated semiconductor circuits. Further, the number of voltage comparators which can be employed in an analog-digital converter of this type is limited.

BRIEF SUMMARY OF THE INVENTION

The present invention therefore has as its objective the production of an arrangement of the general type referred to which can be readily integrated into a semiconductor chip.

This objective is realized by the utilization of a voltage comparator which comprises merely a single transistor and a load element, in which the load element is connected to one of the two remaining transistor terminals, one of which also forms the output of the voltage comparator, and the other transistor terminal forms the second comparator input.

Further embodiments and developments of the invention and methods for the operation of an arrangement in accordance therewith will be apparent from the following disclosure.

An arrangement in accordance with the invention may be readily integrated upon a semiconductor chip and may be operated both as an analog-digital converter as well as a digital-analog comparator. Two or more integrated arrangements, in particular those disposed upon a semiconductor chip, may be connected in parallel and many transistors may be connected with the resistance line whereby a high resolution will be obtained where the arrangement is employed as an analog-digital converter or as a digital-analog converter.

BRIEF DESCRIPTION OF THE DRAWINGS

In the drawings wherein like reference characters indicate like or corresponding parts:

FIG. 13 illustrates a further embodiment of the invention employing a current generator;

FIG. 14 is a schematic circuit diagram illustrating an embodiment of the invention utilizing a specific form of voltage source; and FIG. 15 is a similar schematic circuit illustrating the use of a single voltage source.

DETAILED DESCRIPTION OF THE INVENTION

Figure 1:
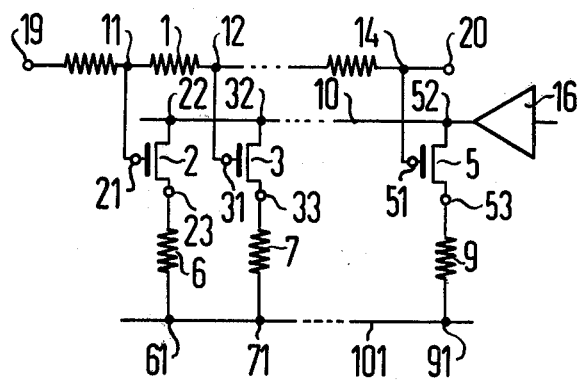
FIG. 1 schematically illustrates a circuit in accordance with the invention.

Referring to the drawings and in particular to FIG. 1, the reference numeral 1 designates a resistance line having respective ends 19 and 20, to which is connected a plurality of transistors 2, 3 . . . 5 which have their control-electrode terminals 21, 31 . . . 51 connected to the resistance line 1 at the respective contact points 11, 12 . . . 14. Connected to the transistor terminals 23, 33 . . . 53 are respective load elements 6, 7 . . . 9. The resistance line 1 can be a continuous resistance or a resistance chain composed of discrete resistances. While the transistors 2, 3 . . . 5, preferably are field-effect transistors as illustrated in FIG. 1, they also may be bipolar transistors.

Figure 2:
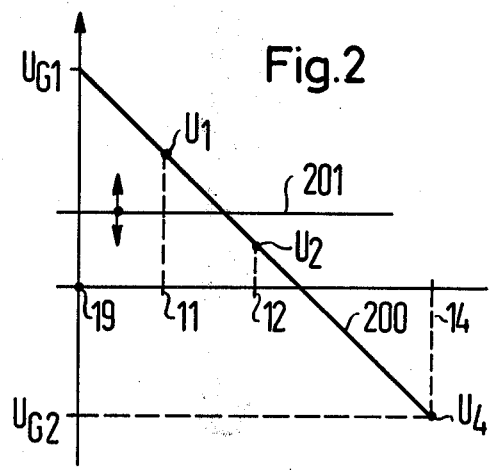
FIG. 2 is a voltage chart for the circuit of FIG. 1.

The arrangement illustrated in FIG. 1 may be readily operated as an analog-digital converter by the utilization of load elements 6, 7 . . . 9 in the form of respective resistances. Upon the application of two different voltages $U_{G1}$, $U_{G2}$ to the respective ends 19 and 20 of the resistance line 1, a voltage drop will be produced along the resistance line, whereby the contact points 11, 12 . . . 14 are at different voltages $U_1$ through $U_4$. In the voltage diagram illustrated in FIG. 2, the voltage drop is shown extending linearly over the entire resistance line as indicated by the straight line 200. In the operation of the converter, the load resistance terminals 61, 71 . . . 91 are supplied with a supply voltage, for example by means of a connection line 101, while the analog signal $U_A$ is applied to the other transistor terminals, for example by means of a connection line 10, the analog signal voltage being amplified if necessary or desirable, by a preceding amplifier 16.

Those transistors 2, 3 . . . 5 whose contact voltages at the respective contact points 1, 12 . . . 14 are greater than the voltage $U_A$ less the threshold voltage $U_T$ of the transistors, will be rendered conductive. If $U_T$ is assumed to be 0 volts, for the purposes of simplicity this will mean that the transistor 2 is switched conductive for an instantaneous value $U_A$ of the analog signal, represented by the straight line 201, while all other transistors will be in a blocking condition. Thus, upon application of the analog signal $U_A$ the number of the transistors rendered conductive will represent the respective amplitude value. The digital value corresponding to the analog value involved will be obtained at the transistor terminals 23, 33 . . . 53.

In the event the arrangement according to the invention is utilized as analog-digital converter with the above described mode of operation, the respective transistors will be actuated at different voltages and if MOS field-effect transistors are employed, this will involve the disadvantage that the substrate control effect will affect the individual transistors differently, resulting in different threshold voltages $U_T$ of the respective transistors and will thus produce an undesired non-linearity.

Figure 3:
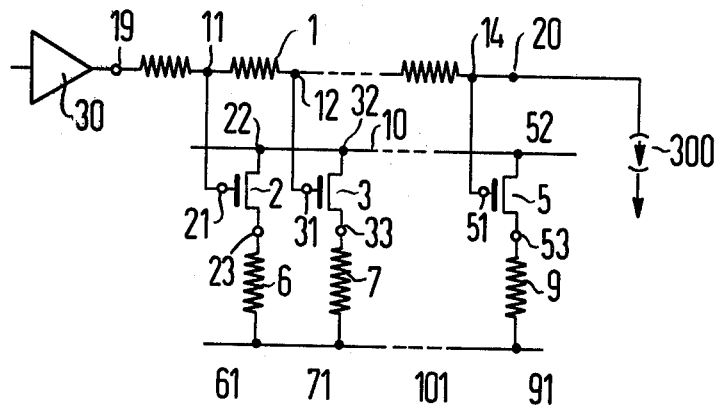
FIG. 3 is a schematic circuit of an analog-digital converter embodying the invention.

FIG. 3 illustrates an analog-digital converter circuit, in accordance with the invention in which the substrate control effect will not influence the operation. In this arrangement the triggering of the converter if effected over the resistance line whereby the analog signal, if required, may be supplied over a signal amplifier 30, to the end 19 of the resistance line. The opposite end of the resistance line is operatively connected to a current generator 300, whereby a voltage drop is produced across the resistance line which is independent of the analog-signal voltage $U_A$. In this case the transistor terminals 22, 32, 52 are either grounded or connected to a supply potential, for example, over a connection line 10, while the terminals 61, 71, 91 of the respective resistances are either connected to supply potential or to ground, for example over a connection line 101.

Figure 4:
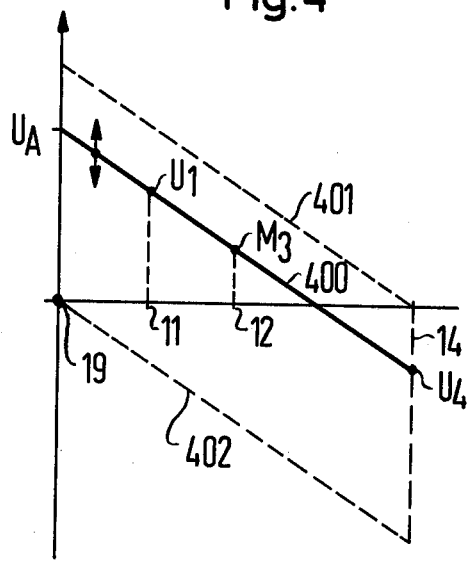
FIG. 4 is a voltage chart similar to FIG. 2 for the circuit of FIG. 3.

The digital signal corresponding to the respective analog-signal value is again obtained over the respective transistor terminals 23,33,53. The voltages $U_1$ through $U_4$ appearing at the contact points 11 through 14 of the resistance line are illustrated in the voltage diagram of FIG. 4 in which the straight line 400 represents the voltage drop along the resistance line, in this case for an instantaneous value $U_A$, with the transistor terminals 23, 33, 53. The voltages $U_1$ through $U_4$ appearing at the contact points 11-14 of the resistance line are illustrated in the voltage diagram of FIG. 4 in which the straight line 400 again represents the voltage drop along the resistance line, in this case for an instantaneous value use of A. The voltages $U_1$ through $U_4$ likewise are again represented by dots. Similarly, the intersection of the abscissa with the ordinate corresponds to the threshold voltage $U_T$. Those transistors having a contact voltage greater than the threshold voltage $U_T$ thus are switched conductive, which in FIG. 4 would be the transistors 2 and 3. The broken line 401 again represents the boundary case where all transistors are switch conductive while the line 402 represents the boundary case where all transistors are blocked. The analog signal $U_A$ thus renders those transistors conductive which are representative of the respective amplitude value, the analog signal which can be derived at the terminals 23-53 of the respective transistors.

Figure 5:
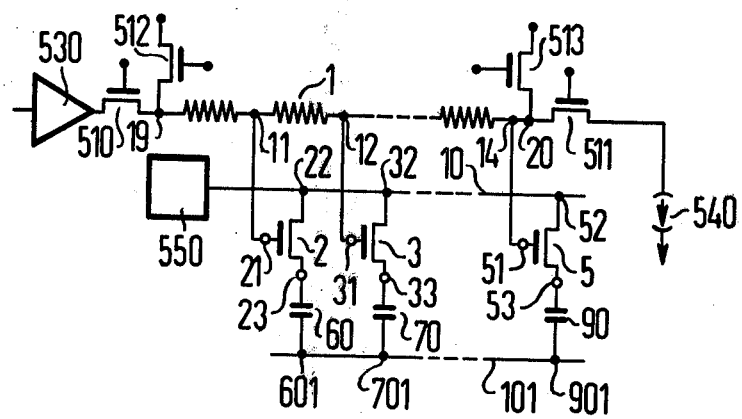
FIG. 5 is a schematic circuit of an analog-digital converter, embodying the invention, designed for dynamic operation.

An analog-digital converter constructed in accordance with the invention can also be operated dynamically, which has the advantage that the power consumption is reduced and the conversion speed may be increased. An arrangement, in accordance with the invention, suitable for dynamic operation is illustrated in FIG. 5, which circuit is generally similar to that illustrated in FIG. 3 but differs primarily in the utilization of load elements in the form of respective capacitances 60, 70, 90 etc. Further, the analog signal is applied to one end 19 of the resistance line over a switching transistor 510, an amplifier 530 being provided if required. The opposite end of the resistance line is connected over a switching transistor 511 to a current generator 540, while additional switching resistors 512 and 513 are provided which enable both ends of the resistance line to be placed on supply potential. The respective transistor terminals 22-52 are connected to an impulse generator 550, for example over a connection line 10, while the capacitor terminals 601 through 901 are placed on fixed potential, preferably ground, for example over a connection line 101.

Figure 6:
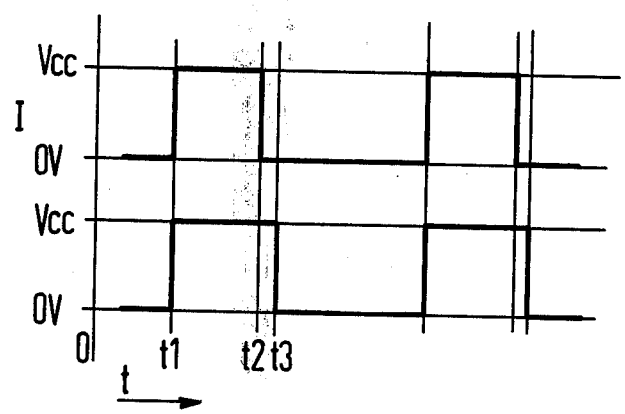
FIG. 6 is a voltage-impulse diagram for the time period t.

Reference is made to the impulse diagrams I and II illustrated in FIG. 6 in connection with which the mode of operation of the converter of FIG. 5 will be described. The two switching transistors 512 and 513 and the switching transistors 510 and 511 are operated in opposite sequence, i.e. the switching transistors 512 and 513 are always conductive when the transistors 510 and 511 are blocked. Assuming that the transistors 512 and 513 are controlled by the control impulses I, at the instant t1, the transistors 512 and 513 are conductive, to apply supply voltage $V_{cc}$ to the terminals 19 and 20 of the resistance line 1, and thus to the respective contact points 11 through 14. It will be noted that the leading flanks of the impulses from the impulse generator 550 on the connection line 10 coincide with the leading flanks of the impulses I, but the impulses II have somewhat greater duration. The impulses II thus will effect a connection of the line 10 alternately to ground and to the supply voltage $V_{cc}$. During the impulse duration of the impulses I, i.e. during the time period $t_2-t_1$, the capacitors 60 through 90 will be charged to the supply potential $V_{cc}$, while at the instant $t_2$, the transistors 512 and 513 are blocked and the transistors 510 and 511 rendered conductive, whereby the analog signal will be applied to the resistance line and produce a voltage drop thereacross. At the time $t_3$, the connection line 10 is placed on ground which will discharge those capacitors whose corresponding transistors have a contact voltage which is larger than the threshold voltage $U_T$. The analog signal will thus cause a corresponding number of capacitors to discharge which are representative of the amplitude value of the analog signal. Again, the digital signal is obtained in parallel over the transistor terminals 23-53.

Figure 7:
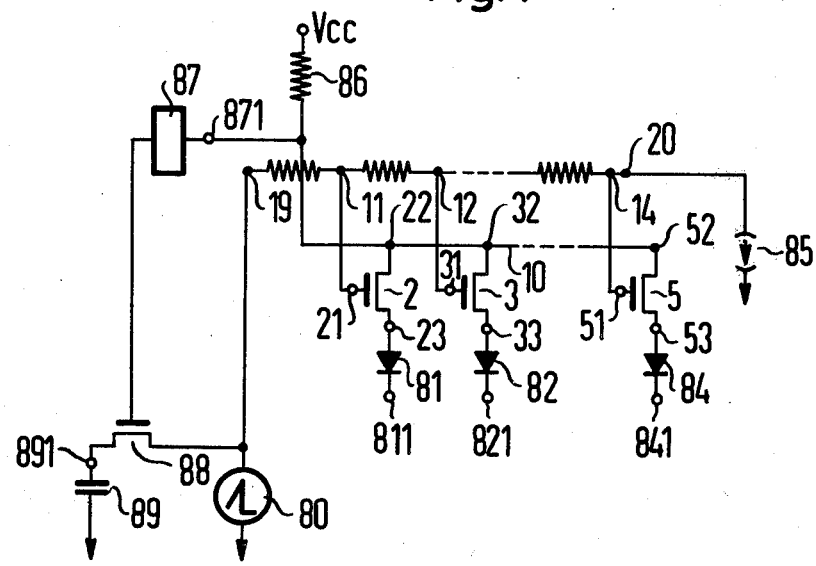
FIG. 7 is a schematic circuit of a further embodiment of a digital-analog converter according to the invention.

An arrangement in accordance with the invention can also be utilized as a digital-analog converter which, in the embodiment illustrated in FIG. 7, employs a sawtooth wave form. A primary difference, as compared with the previously described circuits, resides in the use of diodes 81, 82 . . . 84 as the respective loads elements. In this arrangement, the diode terminals 811, 821 . . . 841 are not inter-connected but instead form the digital inputs of the digital-analog converter, the diodes being provided to eliminate a mutual direct-current coupling of the digital inputs.

In this construction, the diodes 81-84 are connected to the transistors 2-5 in pass direction. A sawtooth generator 80 is connected to one end of the resistance line, i.e. the end 19 illustrated in FIG. 7, and a current generator 85 is connected to the other end 20 of the line. Supply voltage $V_{cc}$ is applied to the transistor terminals 22-52 over a connection line 10 and a series resistance 86, and, in addition, are connected over the impulse generator 87 with the control electrode of a transistor 87 with the control electrode of a transistor 88. The latter connects the output of the sawtooth generator 80 with one electrode of a capacitor 89, the opposite electrode of which is grounded. The analog signal can be derived at one of the electrodes of the capacitor 89. The pulse generator 87 is operative to produce an impulse of short duration from a voltage change, which impulse will switch on the transistor 88 for a short period and will thus charge the capacitor 89 to the instantaneous voltage.

In operation, the sawtooth generator 80 produces a voltage $U_{G1}$ which increases, for example, from 0 volts to $U_{G1MAX}$, which is operative to prepare the successive transistors 2–5. The binary "1" and "0" states are designated at the respective inputs of the converter by the respective supply voltages $V_{cc}$ and 0 volts. Thus, the transistor, which is initially switched conductively by the sawtooth voltage $U_{G1}$ and which has an initial voltage of 0 volts, will cause a voltage change that in turn will, in conjunction with the operation of the pulse generator 87 and the switching of the transistor 88 effect a charging of the capacitance 89 to the corresponding sawtooth voltage. A staircase voltage will accordingly eventually be produced at such capacitance corresponding to the applied digital information.

A digital-analog converter employing a sawtooth generator also can be operated in common collector circuit, with the construction of the converter differing primarily from that illustrated in FIG. 7 in that the diodes 81 through 84 are connected to the transistors in the blocking direction, with the transistors operating in common collector mode. Further, in such case the supply voltage $V_{cc}$ is not connected to the resistance 86 but for example 0 volts, and the binary "1" state as determined with the use of the sawtooth voltage $U_{G1}$ will result in the converter storing the corresponding sawtooth voltage in the capacitor 89.

Figure 8:
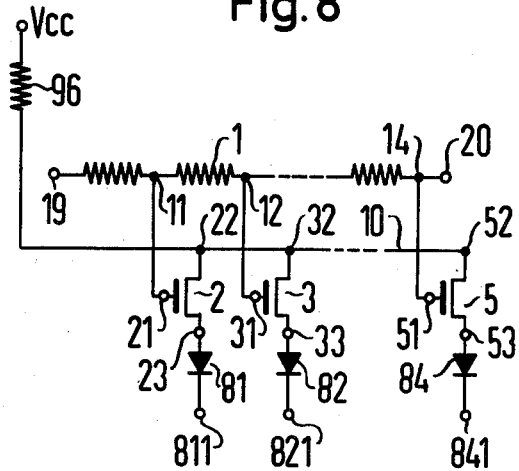
FIG. 8 illustrates the schematic circuit of a digital-analog converter with preset values.

The circuitry of a digital-analog converter having weighted values is illustrated in FIG. 8. This converter consists merely in the transistors 2–5, diodes 81–84, connected to the transistors in pass direction, resistance line 1 and the resistance 96, connected to the transistor terminals 22–52 over connection line 10. Two voltages $U_{G1}$ and $U_{G2}$ are applied to the respective ends 19 and 20 of the resistance line. Thus, the transistors may be likened to a set of weights where each transistor represents a predetermined value, producing different currents through the resistance 96 as the transistors are operatively connected to different contact points along the resistance line and have different gate voltages. The control of the transistors is effected by means of digital information supplied to the respective diodes 811–841 with only that transistor being switched conductive which has a binary "0" state as its input. A staircase voltage is produced at the resistance 96 which thus corresponds to the applied digital information. Such staircase voltage represents the analog signal $U_A$ and is derived at the connection line 10.

Figure 9:
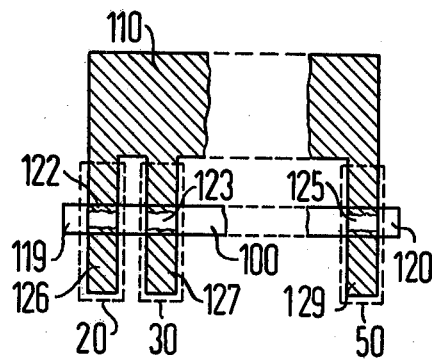
FIG. 9 is a plan view of a semiconductor arrangement embodying the invention.

FIG. 9 is a semidiagrammatic plan view of a structure by means of which the present invention can be practiced, with one or a row of several insulator-layer, field-effect transistors 20, 30, 50 being provided, each of which has doped areas in the semiconductor substrate forming source and drain electrodes. It may be noted that the expression "insulator-layer field-effect transistor", as distinguished from a "barrier-layer field-effect transistor" refers to a transistor which is in the form of a MIS field-effect transistor or a MOS field-effect transistor, but whose gate electrode is not necessarily made of metal. The transistors 20–50 of FIG. 9 are disposed in parallel relation with respect to one another and have a root or width w and a spacing from one another of z. One doped electrode of each transistor is a part of a continuous doped area 110 which thus is common to all transistors. The other doped electrode of such transistors each comprise an outwardly directed contact terminal 126 through 129. The electrodes of adjacent field-effect transistors in the row are interconnected by electrical resistance material while being insulated from the semiconductor substrate to form a continuous gate line 100 which, during operation, serves two functions as follows:

(a) The control of the corresponding transistors,
(b) The production of the contact voltages $U_1$ through $U_4$, whereby the gate line forms the resistance line.

The gate line 100 of FIG. 9 is illustrated as being continuous which is to indicate that the gate electrodes of the transistors and the connections between the gate electrodes are in this case made of the same material.

Figure 10:
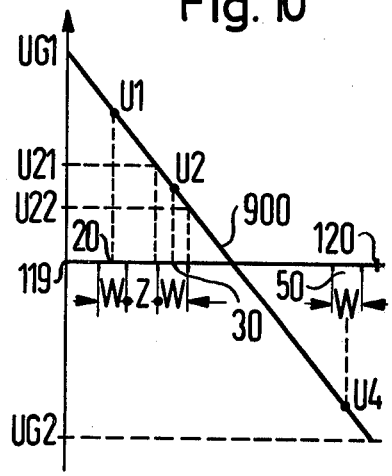
FIG. 10 is a voltage chart in connection with the operation of circuit of FIG. 9.

FIG. 10 illustrates a voltage diagram for the circuit of FIG. 9 relative to the length of the gate line which is subdivided corresponding to the transistor width w and the transistor spacing z. In this diagram the straight line 900 represents the voltage drop along the gate line between the voltage values $U_{G1}$ and $U_{G2}$ applied at the ends 119 and 120. The contact voltages $U_1$ through $U_4$ can be computed from the average value of the gate-marginal voltages of the corresponding transistors stages. The voltage $U_2$, for example, can be calculated from the gate-marginal voltages $U_{21}$ and $U_{22}$, for the transistor 30, which amounts to $U_2=(U_{21}$ and $U_{22})/2$.

As heretofore described, the gates are operated with a gate voltage which can be computed as the average value of the gate-marginal voltages and it will be apparent that in order to derive a high conversion speed it is advantageous to operate the transistors with as high a gate voltage as reasonably possible.

Figure 11:
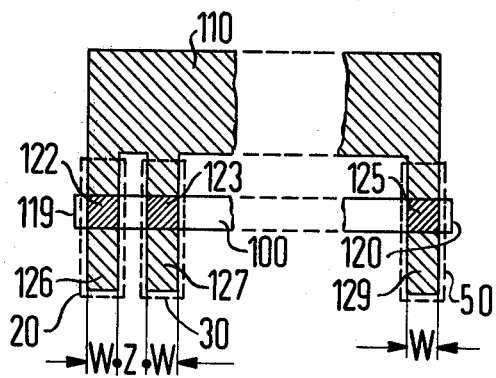
FIG. 11 is a plan view similar to FIG. 9 of a further semiconductor structure in accordance with the invention.
Figure 12:
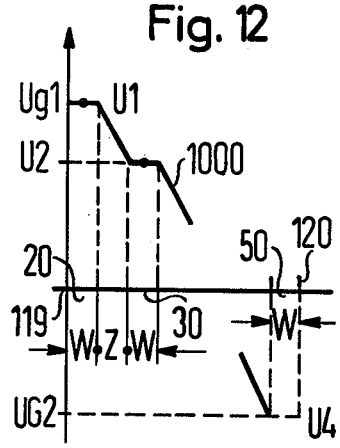
FIG. 12 is a voltage chart in connection with the operation of the structure of FIG. 11.

FIG. 11 illustrates an arrangement in which the gate electrode areas 122 through 125 of the field-effect transistors have a lower resistance value than the connections between such electrodes, as a result of which no voltage drop is produced along the gate electrodes of the transistors. If it is desired to utilize silicon gate technology, it is advantageous to achieve the low resistance by means of metal gate electrodes. The voltage drop along the gate line so constructed is illustrated by the staircase-shaped curve 1000 of the voltage diagram of FIG. 12.

The gate length is, in this case, subdivided into transistor areas and intermediate areas disposed therebetween. A voltage drop occurs only in the intermediate areas while the voltage is constant in the actual gate areas of the transistors. Such constant voltage thus corresponds to one of the contact voltages $U_1$ through $U_4$ and is equal to the maximum gate-marginal voltage of the corresponding transistor area. As a result, the contact voltage is higher than the contact voltage involved in FIG. 9.

The arrangements illustrated in FIGS. 9 and 11 also may be connected in parallel.

Analog-digital converters or digital-analog converters, constructed in accordance with the invention, may be so designed that they produce a linear or non-linear quantizing, i.e. the analog-signal is subdivided into equally large or different quantizing stages. In the case of a non-linear quantizing, the resistances will involve different resistance values. Where a physical construction such as illustrated in FIG. 9 on FIG. 11 is involved, a linear or non-linear quantizing can be derived by a corresponding proportioning of the spacing z wherein uniform or different dimensions may be employed.

In the arrangements illustrated in FIGS. 9 and 11, the load elements may be connected to the transistor electrodes provided with the contact terminals 126 through 129, either over such terminals or to the doped areas. Where the load elements are to comprise resistances, they may be formed by layer resistances which contact the transistor electrodes formed with the contact terminals. In similar manner where capacitors are involved, they may be produced in the form of MIS capacitors.

In the previously described arrangements and methods of operation, the voltage drop along the resistance line is derived either by voltages applied to the ends of the resistance line or by means of a current generator producing a constant current, whereby the voltage drop produced thereby is resistance-dependent. Resistance changes may, for example, also be caused by temperature fluctuations whereby the voltage drop along the resistance line is also temperature-dependent. FIGS. 13 and 14 illustrate arrangements in which the voltage drop along the resistance line is maintained constant.

FIG. 13 illustrates an arrangement in which the voltage drop along the resistance line is produced by a current generator. At one end 20 of the resistance line 1 of the arrangement, a transistor 301 and a resistance 302 is connected in series, in which the resistance 302 is formed from a resistance material whose resistance value possesses the same temperature dependence as the resistance value of the resistance line. Preferably, the transistor 301 is a field-effect transistor, the control electrode of which is designated by the reference numeral 3011, while the remaining two electrodes are designated 3012 and 3013. The voltage drop $U_w$ along the resistance line between the ends 19 and 20 can be computed to be: $U_w = (U_s - U_T - U_{ss})R_w/R$, in which $U_s$ represents the voltage at the control electrode 3011 of the transistor, $U_{ss}$ the voltage at the terminal 3021 of the resistance 302, $U_T$ the initial voltage of the transistor 301, $R_w$ the resistance value of the resistance line, and R the resistance value of the resistance 302. If the resistance $R_w$ changes, for example with temperature change, the resistance R will change to the same extent. As a result the relation $R_w/R$ and thus $U_w$ remains constant.

The arrangement illustrates in FIG. 13 requires little expense with respect to component elements and thus is particularly suitable for integration. Furthermore, the arrangement is not sensitive with respect to resistance fluctuations. During operation of this arrangement, as an analog-digital converter or as an Sa digital-analog converter, a high degree of accuracy will result. The arrangement illustrated in FIG. 13 may be operated in all of the described modes of operation.

FIG. 14 illustrates an arrangement in which the voltage drop across the resistance line is produced by two voltage sources. In this arrangement each end 19, 20 of the resistance line 1 is connected with a respective output 3033, 3043 of an inverted amplifier 303 or 304, respectively, the inputs 3030, 3040 of the amplifiers being interconnected over resistances 305, 307. The output of each amplifier is also connected with the input of such amplifier over a resistance 3032, 3042, respectively. In addition, the input 3030 of the amplifier 303 is connected over a further resistance 306 to a terminal element.

The amplifiers apply respective voltages $U_1$ and $U_2$ to the ends 19 and 20 of the resistance line, whereby the resistance value $R_w$ of the resistance line has no effect of the voltage $U_w$ along the resistance line. The voltage drop $U_w$ is so produced that a voltage $U_w$ is added to a voltage $U_{IN}$ applied to the connecting point of the resistance 305 and 307 and the input 3030 of the amplifier 303. If the relationship of the resistance values of the resistances 305 and 3032 is so selected that it is equal to the relationship between the resistance values of the resistances 307 and 3042, then the voltages $U_1$ and $U_2$ can be computed as follows:

$$U_1 = -(U_{IN} + U_w) \text{ and } U_2 = -U_{IN},$$

a voltage drop will therefore be produced along the resistance line from $U_1 - U_2 = -U_w$.

The arrangement illustrated in FIG. 14 can be operated in all of the described modes of operation. During operation of an analog-digital converter, wherein the analog signal is supplied to an end of the resistance line, the analog signal will be applied at the connecting point of the resistances 305 and 307.

FIG. 15 illustrates an arrangement somewhat similar to that of FIG. 14 but employing only a single voltage source, the ends 19, 20, of the resistance line 1, in this case, being interconnected over a differential amplifier 3034. One end 19 of the line is connected with the positive differential input 3035 of the amplifier over a resistance 3051 with the output 3038 of the differential amplifier being returned to the negative differential input 3039 over a resistance 3036. The negative differential input is also connected to ground over a resistance 3037. The positive differential input is connected with a terminal element 3081 over a resistance 3061. If the values of the resistances 3051, 3061, 3037 and 3036 are designated as $R_1$, $R_2$, $R_3$ and $R_4$, then a voltage drop will be obtained along the resistance line which is independent of the value of the resistance line and independent of a voltage $U_{IN}$ applied to the end 19 of the resistance line when the resistance values $R_1$ and $R_4$ are selected in accordance with the following:

$$R_3/(R_3+R_4) = R_1/(R_1+R_2) = \tfrac{1}{2}.$$

If the resistances 3051, 3061, 3036 and 3037 are constructed of the same material, resistance changes due to temperature, effecting the respective resistances uniformly will not produce a change in the relationship of the resistances and thus neither the voltage at the positive differential input 3035 of the amplifier or the amplification. The arrangement illustrated in FIG. 15 likewise may be operated in all of the described operational modes and where employed as an analog-digital converted in which the analog signal is supplied to one end of the resistance line, the arrangement should be such that the analog signal is supplied to the end 19 of the resistance line.

It will be appreciated that either of the constructions illustrated in FIGS. 14 and 15 may be readily integrated upon a semi-conductor member.

Having thus described my invention it will be obvious that although various minor modifications might be suggested by those versed in the art, it should be understood that I wish to embody within the scope of the patent granted hereon all such modifications as reasonably, and properly come within the scope of my contribution to the art.

I claim as my invention:

1. A method of operating an analog-digital converter having a resistance line and a plurality of voltage comparators, each comprising a transistor and a load element in the form of a capacitor, in which the control electrode of each transistor forms a first comparator input which is connected to a respective point on the resistance line, with the cooperable load element connected to one of the two remaining transistor terminals, one of which also simultaneously forms the output of such voltage comparator, the other transistor terminal forming the second comparator input for such voltage comparator, respective transistor switches disposed at each end of the resistance line, one of which is operative to connect the signals to be converted to the resistance line, the second operative to connect a current generator to the other end of the resistance line, and each end of the resistance line having a respective switching transistor connected thereto comprising third and fourth transistors, for selectively connecting a voltage source across the resistance line, comprising the steps of placing the free ends of the load elements on a fixed potential, applying impulses to the second comparator inputs, operating the first and second transistors alternately with the third and fourth transistors whereby the first and second are conductive while the third and fourth are blocked and vice versa, applying said impulses to the second comparator inputs when said second and fourth transistors are conductive, and rendering such transistors nonconductive prior to the termination of the corresponding impulse, with the digital signals simultaneously appearing in parallel at the outputs of the voltage comparators.

* * * * *